US005546022A

United States Patent [19]
D'Souza et al.

[11] Patent Number: 5,546,022
[45] Date of Patent: Aug. 13, 1996

[54] STATIC LOGIC CIRCUIT WITH IMPROVED OUTPUT SIGNAL LEVELS

[75] Inventors: Godfrey P. D'Souza, Santa Clara; Douglas A. Laird, Los Gatos, both of Calif.

[73] Assignee: Sun Microsystems, Inc., Mountain View, Calif.

[21] Appl. No.: 357,447

[22] Filed: Dec. 16, 1994

[51] Int. Cl.$^6$ .................... H03K 19/0175; H03K 19/094
[52] U.S. Cl. .............................................. 326/87; 326/121
[58] Field of Search ............................... 326/121, 81, 83, 326/80, 87

[56] References Cited

U.S. PATENT DOCUMENTS

| | | | |
|---|---|---|---|
| 4,963,766 | 10/1990 | Lundberg | 326/81 |
| 5,175,445 | 12/1992 | Kinugasa et al. | 326/121 |
| 5,389,834 | 2/1995 | Kinugasa et al. | 326/121 |
| 5,391,939 | 2/1995 | Nonaka | 326/121 |

OTHER PUBLICATIONS

Neil H. E. Weste and Kamran Eshraghian, "Principles of CMOS VLSI Design, A Systems Perspective", Second Edition, Addison–Wesley Publishing Company, 1993, pp. 298–302 and 308–311.

Saburo Muroga, "VLSI System Design, When and How to Design Very–Large–Scale Integrated Circuits", John Wiley & Sons, 1982, pp. 221–224.

Yasuhiko Tsukikawa, Takeshi Kajimoto, Yasuhiko Okasaka, Yoshikazu Morooka, Kiyohiro Furutani, Hiroshi Miyamoto and Hideyuki Ozaki, "An Efficient Back–Bias Generator with Hybrid Pumping Circuit for 1.5-V DRAM's", IEEE Journal of Solid–State Circuits, vol. 29, No. 4, Apr. 1994, pp. 534–538.

Ingemar Karlsson, "True Single Phase Clock Dynamic CMOS Circuit Technique", 1988 IEEE, pp. 475–478.

Yuan Ji–Ren, Ingemar Karlsson and Christer Svensson, "A True Single–Phase–Clock Dynamic CMOS Circuit Technique", IEEE Journal of Solid–State Circuits vol. SC–22, No. 5, Oct. 1987, pp. 899–901.

Jiren Yuan, Christer Svensson, "High–Speed CMOS Circuit Technique", IEEE Journal of Solid–State Circuits, vol. 24, No. 1, Feb. 1989, p. 62.

Takeshi Sakata, Kiyoo Itoh, Masashi Horiguchi and Masakazu Aoki, "Two–Dimensional Power–Line Selection Scheme for Low Subthreshold–Current Multi–Gigabit DRAM's", IEEE Journal of Solid–State Circuits, vol. 29, No. 8, Aug. 1994, pp. 887–894.

Takeshi Sakata, Kiyoo Itoh, Masashi Horiguchi and Masakazu Aoki, "Subthreshold–Current Reduction Circuits for Multi–Gigabit DRAM's", IEEE Journal of Solid–State Circuits, vol. 29, No. 7, Jul. 1994, pp. 761–771.

Takayuki Kawahara, Masashi Horiguchi, Yoshiki Kawajiri, Goro Kitsukawa, Tokuo Kure and Masakazu Aoki, "Subthreshold Current Reduction for Decoded–Driver by Self––Reverse Biasing", IEEE Journal of Solid–State Circuits, vol. 28, No. 11, Nov. 1993, pp. 1136–1144.

*Primary Examiner*—Edward P. Westin
*Assistant Examiner*—Richard Roseen
*Attorney, Agent, or Firm*—Limbach & Limbach L.L.P.

[57] ABSTRACT

A static logic circuit with improved output signal levels includes a static complementary MOSFET circuit with a signal node and pull-up and pull-down amplifiers, each with at least one biasing circuit, connected thereto. The pull-up and pull-down amplifiers are connected to VDD and VSS, respectively, and receive one or more logic signals (e.g. one for an inverter and more for logic gates such as AND, OR, etc.) and one or more bias signals and in accordance therewith provide pull-up and pull-down voltages, respectively, to the signal node. In accordance with the applied pull-up or pull-down voltage, the signal node charges to a charge state with an associated node voltage approximately equal to VDD or VSS, respectively. Each biasing circuit receives the same input logic signal as its associated pull-up or pull-down amplifier and provides thereto a bias signal approximately equal to VSS or VDD, respectively. In accordance with its input logic signal, each pull-up or pull-down amplifier together with its associated biasing circuit provides either an active current path between the signal node and VDD or VSS for applying the desired pull-up or pull-down voltage, respectively, or a leakage current path between VDD and VSS for preventing the application of an undesired pull-down or pull-up voltage during application of the desired pull-up or pull-down voltage, respectively.

27 Claims, 9 Drawing Sheets

STATIC LOGIC CIRCUIT WITH IMPROVED OUTPUT SIGNAL LEVELS

BACKGROUND OF THE INVENTION

1. Field of the Invention

The present invention relates to static C-MOSFET logic circuits, and in particular, to static C-MOSFET logic circuits operating with low power supply voltages.

2. Description of the Related Art

Integrated circuits using static logic circuitry with complementary metal oxide semiconductor field effect transistors (C-MOSFETs) have seen much use in recent years because of such circuitry's advantage of low power consumption. A typical logic cell in such circuits includes one or more P-type MOSFET (P-MOSFET) pull-up circuits and one or more N-type MOSFET (N-MOSFET) pull-down circuits connected to an output signal node. In accordance with the input logic signals, the pull-up and pull-down circuits either pull the output node up toward VDD or down toward VSS by applying a charging current thereto or sinking a discharging current therefrom, respectively.

As MOSFET technology has evolved, individual MOSFETs have become steadily smaller, e.g. with smaller feature sizes, particularly shorter channel lengths. This has allowed more and more MOSFETs to be integrated together in one integrated circuit (IC), as well as allow the requisite power supply voltage (VDD) to become smaller as well. Benefits of the former include reduced size and increased operating frequencies, while benefits of the latter include reduced power consumption. However, operating MOSFETs at today's lower power supply voltages has the undesirable effect of lowering MOSFET current which reduces the maximum operating frequency. Hence, in order to minimize reductions in circuit performance, the MOSFET threshold voltages ($V_{TH}$) are reduced so as to minimize reductions in the MOSFET current. (Further discussion of the relationship(s) between power supply voltage, threshold voltage and operating performance for MOSFETs can be found in commonly assigned, copending U.S. patent application Ser. No. 08/292,513, filed Aug. 18, 1994, and entitled "Low Power, High Performance Junction Transistor", the disclosure of which is hereby incorporated herein by reference.) However, this in turn has the undesired effect of increasing MOSFET leakage current, i.e. MOSFET current flowing when the device is turned off. This results in charges leaking to and from the output node of each logic cell which prevents output signal levels from achieving and maintaining full VDD and VSS values, thereby decreasing noise immunity and increasing chances of failure due to data losses caused by charges leaking to or from the output nodes.

Accordingly, it would be desirable to have a static logic circuit having transistors with reduced threshold voltages so as to take maximum advantage of the benefits available from the use of lower power supply voltages while simultaneously minimizing chances of failure due to data losses caused by charge leakage to or from data storage nodes, minimizing reductions in maximum operating frequency and providing improved output signal levels for improved noise immunity.

SUMMARY OF THE INVENTION

The present invention relates to static CMOS logic circuits constructed from low powered MOS devices with output signals which do not suffer from the detrimental effects of current leakage through the pull-up and pull-down transistors. The improved output signal levels are achieved by selectively applying voltage biasing within a static logic circuit to reverse bias the pull-up or pull-down transistors which receive and process the input logic signals thereby ensuring that the pull-up or pull-down transistors are fully cut off when turned off by such input logic signals, thereby reducing charge and discharge leakage currents and maintaining peak signal voltage levels at the output signal node. This advantageously allows the logic circuit to have transistors with reduced threshold voltages so as to take maximum advantage of the power-saving benefits available with the use of lower power supply voltages (e.g. less than 3.5 volts) while simultaneously minimizing chances of failure due to data losses caused by charge leakage to or from data storage nodes, minimizing reductions in maximum operating frequency and providing improved output signal levels for improved noise immunity.

An apparatus with a low powered static logic circuit with improved output signal levels in accordance with one embodiment of the present invention includes first and second supply nodes, a signal node, an input circuit and a bias circuit. The first and second supply nodes are for operating at first and second voltage levels, respectively. The input circuit is coupled between the signal node and the first supply node for receiving an input signal and in response thereto coupling the signal node to the first supply node at the first voltage level. The bias circuit is coupled between the signal node and the second supply node for substantially maintaining the first voltage level at the signal node when the signal node is coupled to the first supply node by the input circuit.

These and other features and advantages of the present invention will be understood upon consideration of the following detailed description of the invention and the accompanying drawings.

BRIEF DESCRIPTION OF THE DRAWINGS (Corresponding elements are identified with corresponding alphanumeric designators throughout the drawings.)

DETAILED DESCRIPTION OF THE INVENTION

Figure 1:
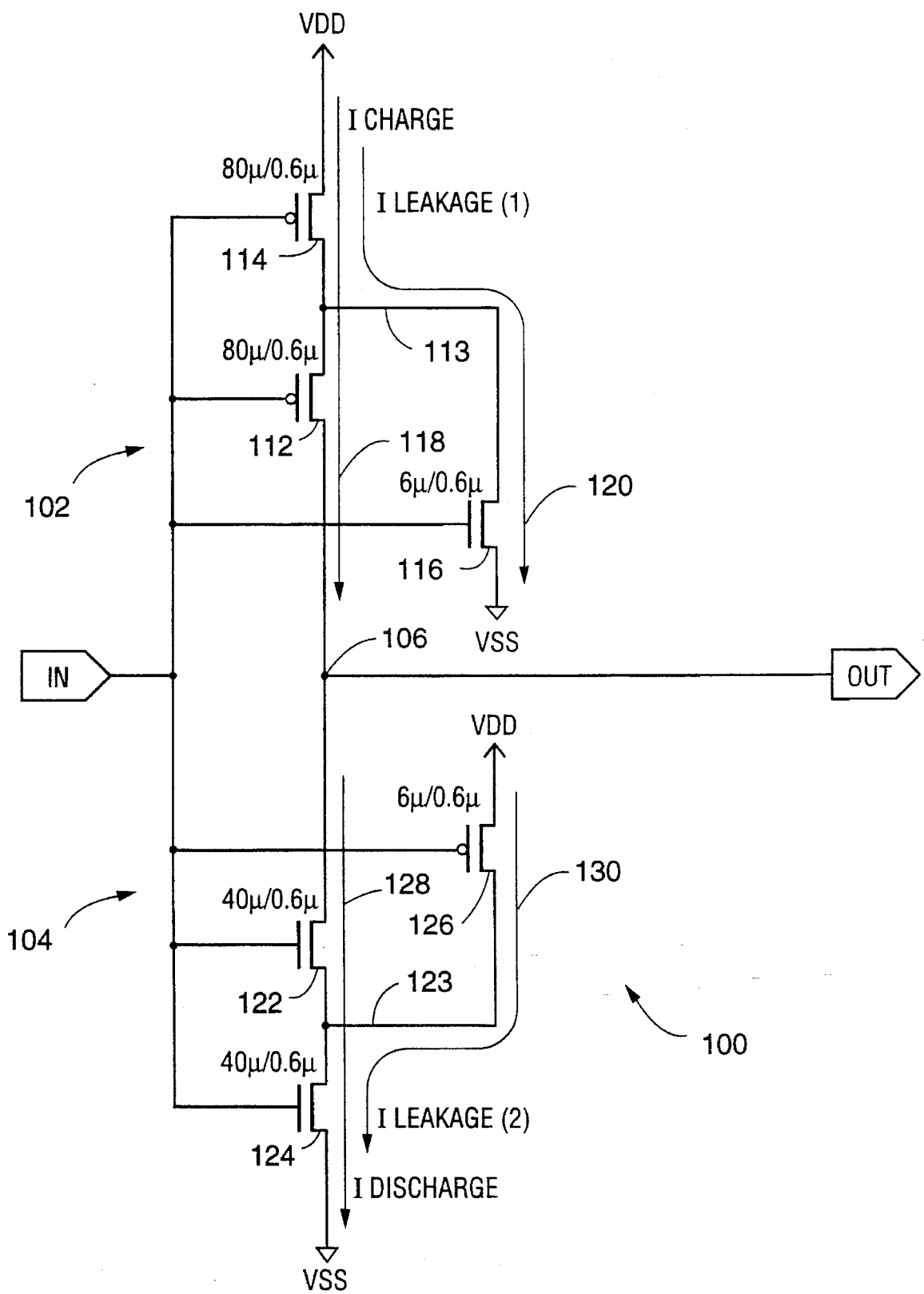
FIG. 1 is a schematic diagram of a static logic inverter circuit with improved output signal levels in accordance with one embodiment of the present invention.

Throughout the following discussion, unless indicated otherwise, it is assumed that all P-MOSFET and N-MOSFET substrates, or "bulks", are connected to their respective, associated power supply terminals (e.g. typically to power supply nodes VDD and VSS, respectively). Also, the alphanumeric legends alongside the various transistors indicate their respective channel widths and lengths. (For example, the widths and lengths of the MOSFETs 122 and 124 in FIG. 1 are 40 microns and 0.6 microns, respectively.) It should be understood that such dimensions are intended to be exemplary only and are not intended to require or be limited to any specific semiconductor processing technology, and as semiconductor processing technology advances further such dimensions may be altered, e.g. reduced, as desired. (For example, it should be understood that fabrication of circuitry embodying the present invention can be done in accordance with many well known semiconductor processes or alternatively, in accordance with those processes discussed in the aforementioned U.S. patent application Ser. No. 08/292,513 or commonly assigned, copending U.S. patent application Ser. No. 08/357,436, filed Dec. 16, 1994, and entitled "Asymmetric Low Power MOS Devices", the disclosures of which are both hereby incorporated herein by reference.) Further, it is assumed that the circuit reference, or ground, node is the VSS terminal (typically with an associated reference, or ground, voltage potential of 0 volts).

Further, in the following discussion, specific examples of various forms of logic gates are discussed. However, it should be understood that all logic functions, e.g. AND, OR, NOR, NAND, EXCLUSIVE-OR, EXCLUSIVE-NOR, etc., can be realized with improved output signal levels in accordance with the present invention. Furthermore, the following discussion assumes the use of "positive" logic, i.e. where a logic 1 is a logic "high" (e.g. a positive voltage) and a logic 0 is a logic "low" (e.g. approximately equal to the circuit reference potential). However, it should be understood that static logic circuits with improved output signal levels in accordance with the present invention can be used with "negative" logic as well, with P-MOSFETs and N-MOSFETs interchanged appropriately in accordance with well known circuit design principles.

Referring to FIG. 1, a static logic inverter circuit 100 with improved output signal levels in accordance with one embodiment of the present invention includes a pull-up amplifier 102 and pull-down amplifier 104 which receive an input logic signal IN and drive a signal node 106 to produce an output signal OUT. The pull-up amplifier 102 includes two P-MOSFETs 112, 114 which together operate as a node pulling amplifier circuit, and an N-MOSFET 116 which operates as a biasing circuit (discussed further below). The pull-down amplifier 104 includes two N-MOSFETs 122, 124 which operate as another node pulling amplifier circuit, and a P-MOSFET 126 which operates as another biasing circuit (discussed further below).

All of the gate terminals of the MOSFETs 112, 114, 116, 122, 124, 126 are interconnected for receiving the input logic signal IN. In the pull-up amplifier 102, the drain terminal of the first P-MOSFET 112 is connected to the signal node 106, the source terminal of the second P-MOSFET 114 is connected to VDD, the source terminal of the N-MOSFET 116 is connected to VSS, and the source terminal of the first P-MOSFET 112 and drain terminals of the second P-MOSFET 114 and N-MOSFET 116 are interconnected. In the pull-down amplifier 104, the drain terminal of the first N-MOSFET 122 is connected to the signal node 106, the source terminal of the second N-MOSFET 124 is connected to VSS, the source terminal of the P-MOSFET 126 is connected to VDD, and the source terminal of the first N-MOSFET 122 and drain terminals of the second N-MOSFET 124 and P-MOSFET 126 are interconnected.

When the input logic signal IN is a logic 0, the N-MOSFETs 116, 122, 124 are turned off and the P-MOSFETs 112, 114, 126 are turned on. In the pull-up amplifier 102, this causes a charge current $I_{CHARGE}$ to flow from VDD to the signal node 106 through the current path 118 formed by the conductive channels of the turned-on P-MOSFETs 112, 114 of the pull-up amplifier 102. Alternatively, this can be described as causing a pull-up voltage approximately equal to VDD to be applied to the signal node 106 through the P-MOSFETs 112, 114. (Since the N-MOSFET 116 is turned off, very little leakage current $I_{LEAKAGE(1)}$ flows due to its small size, thereby causing virtually no effect at the signal node 106.) In the pull-down amplifier 104, a pull-up voltage 123 approximately equal to VDD is applied via the channel and drain terminal of the P-MOSFET 126 to the node connecting the source and drain terminals of N-MOSFETs 122 and 124, respectively. This pull-up voltage causes the gate-to-source voltage of the first N-MOSFET 122 to be substantially negative with respect to the MOSFET threshold voltage ($V_{TH}$). For example, with the input logic signal IN at a logic 0 (e.g. at approximately VSS), the reverse bias applied across the gate and source terminals of the N-MOSFET 122 is approximately equal to VSS-VDD (-VDD when VSS equals 0 volt, or circuit ground). Hence, the first N-MOSFET 122 is completely cut off and conducts virtually no leakage current. Accordingly, any leakage current $I_{LEAKAGE(2)}$ flowing in the pull-down amplifier 104 is "steered" away from the signal node 106 via the leakage current path 130 formed by the "nonconductive" (but leaky) and conductive channels of N-MOSFET 124 and P-MOSFET 126, respectively.

When the input logic signal IN is a logic 1, the P-MOSFETs 112, 114, 126 are turned off, and the N-MOSFETs 116, 122, 124 are turned on. In the pull-down amplifier 104, this causes a discharge current $I_{DISCHARGE}$ to flow from the signal node 106 to VSS through the current path 128 formed by the conductive channels of the turned-on N-MOSFETs 122, 124 of the pull-down amplifier 104. Alternatively, this can be described as causing a pull-down voltage approximately equal to VSS to be applied to the signal node 106 through the N-MOSFETs 122, 124. (Since the P-MOSFET 126 is turned off, very little leakage current $I_{LEAKAGE(2)}$ flows due to its small size, thereby causing virtually no effect at the signal node 106.) In the pull-up amplifier 102, a pull-down voltage 113 approximately equal to VSS is applied via the channel and drain terminal of the N-MOSFET 116 to the node connecting the source and drain terminals of P-MOSFETs 112 and 114, respectively. This pull-down voltage causes the gate-to-source voltage of the first P-MOSFET 112 to be substantially positive with respect to the MOSFET threshold voltage. ($V_{TH}$). For example, with the input logic signal IN at a logic 1 (e.g. at approximately VDD), the reverse bias applied across the gate and source terminals of the N-MOSFET 112 is approximately equal to VDD-VSS (VDD when VSS equals 0 volt, or circuit ground). Hence, the first N-MOSFET 112 is completely cut off and conducts virtually no leakage current. Accordingly, any leakage current $I_{LEAKAGE(1)}$ flowing in the pull-up amplifier 102 is "steered" away from the signal node 106 via the leakage current path 120 formed by the "nonconductive" (but leaky) and conductive channels of P-MOSFET 114 and N-MOSFET 116, respectively.

Computer simulations have shown that in a static logic circuit 100 in accordance with the present invention, when the input logic signal IN is a logic 1 (or logic 0), leakage current $I_{LEAKAGE(1)}$ (or $I_{LEAKAGE(2)}$) conducted by P-MOSFET 112 (or N-MOSFET 122) is visually nil, e.g. in the range of several picoamperes or less, while the "steered" leakage current conducted by the leakage current path 120 formed by P-MOSFET 114 d N-MOSFET 116 (or the leakage current path 130 formed by P-MOSFET 126 and N-MOSFET 124) can be fairly significant, e.g. in the range of a few microamperes.

Figure 1A:
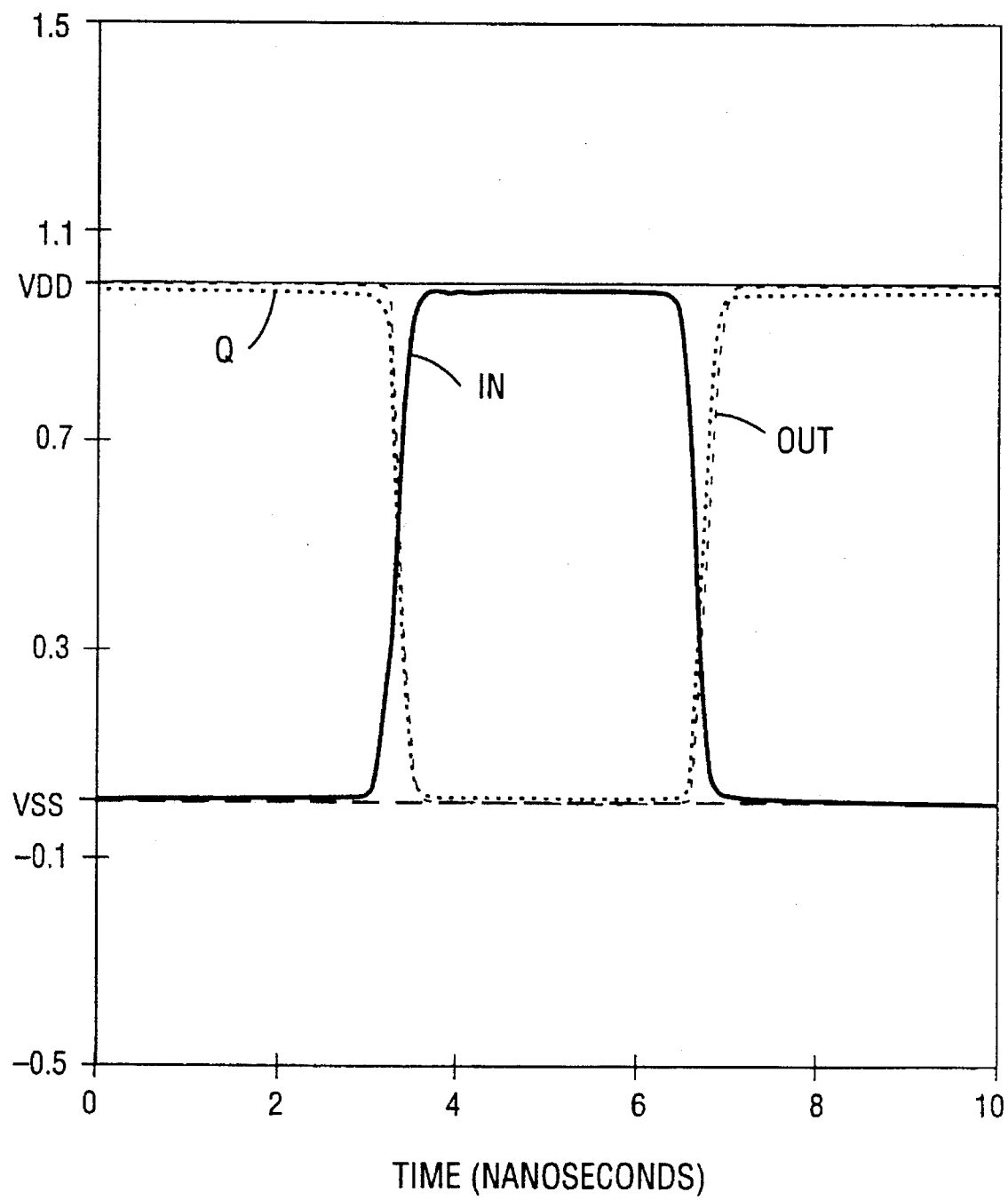
FIG. 1A is a voltage versus time plot for the circuit of FIG. 1.

Referring to FIG. 1A, a voltage versus time plot is illustrated for the static logic inverter circuit 100 of FIG. 1, where VDD is one volt and VSS is circuit ground (zero volt). As can be seen, the positive and negative signal level excursions (i.e. when the output signal OUT is a logic 1 and logic 0, respectively) are approximately equal to VDD and VSS, respectively. (The signal Q represents the output of a corresponding, conventional inverter circuit design, e.g. without P-MOSFETs 112 and 126 and N-MOSFETs 122 and 116, and is shown to illustrate the improved high and low output signal levels, i.e. $OUT_{HIGH} > Q_{HIGH}$ and $OUT_{LOW} < Q_{LOW}$, achieved with the present invention.)

Figure 2:
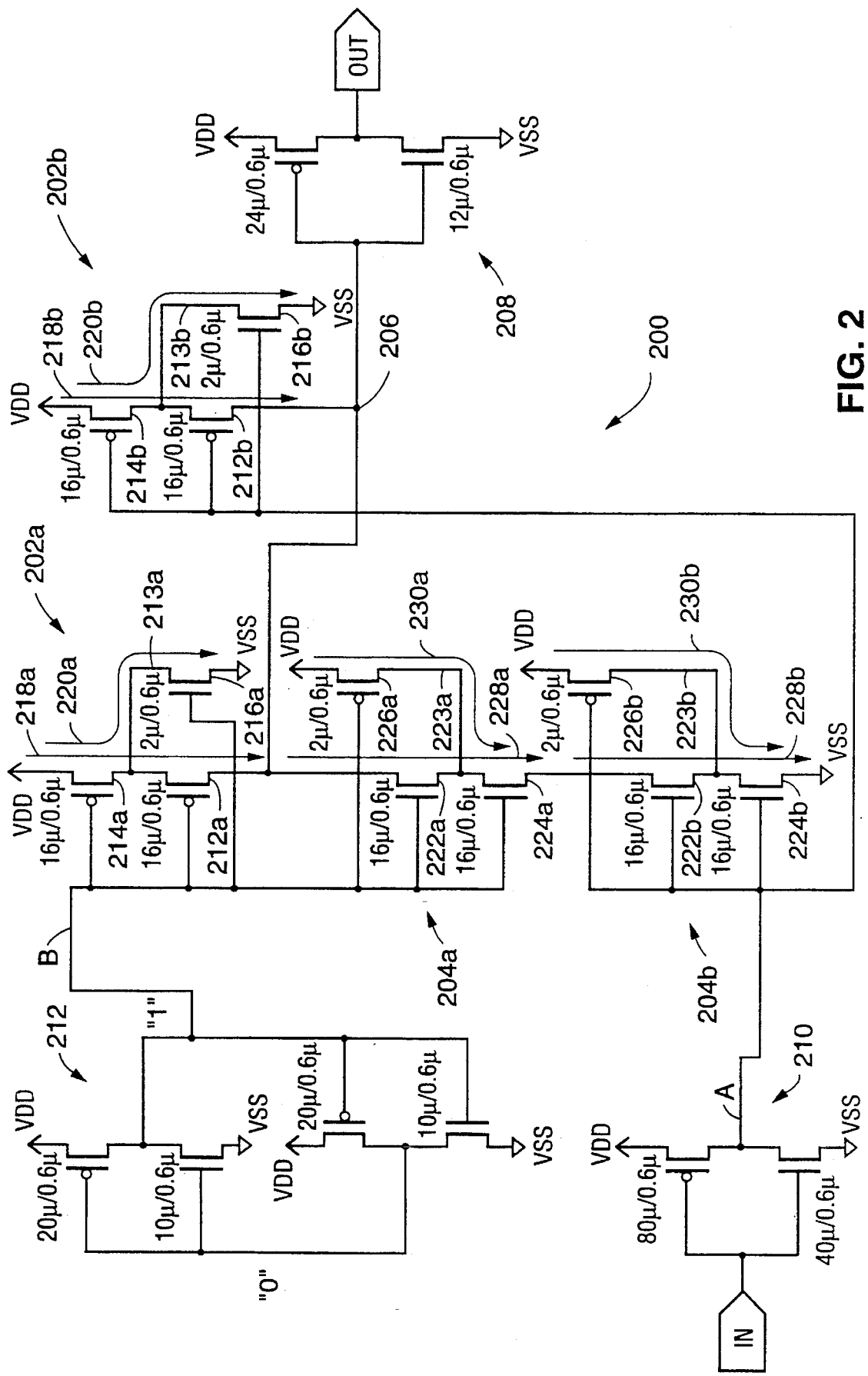
FIG. 2 is a schematic diagram of a static logic NAND gate with improved output signal levels in accordance with another embodiment of the present invention.

Referring to FIG. 2, a static logic, 2-input NAND gate 200 with improved output signal levels in accordance with another embodiment of the present invention includes two pull-up amplifiers 202a, 202b in parallel with one another and two pull amplifiers 204a, 204b in series with one another, all connected to signal node 206, plus an output inverter circuit 208 and an input inverter circuit 210. (Each of the pull-up amplifiers 202a, 202b operates in accordance with the foregoing discussion for the pull-up amplifier 102 of FIG. 1, and each of the pull-down amplifiers 204a, 204b operates in accordance with the foregoing discussion for the pull-down amplifier 104 of FIG. 1.) The active input signal IN is inverter by the input inverter circuit 210 to form input signal A which drives one of the pull-down amplifiers 204b and one of the pull-up amplifiers 202b. The second signal B, preset to a logic 1 (for test purposes only) by use of an inverter latch circuit 212, turns on, or enables, the other pull-down amplifier 204a and turns off, or disables, the other pull-up amplifier 202a.

When the active input signal IN is a logic 0, signal A is a logic 1 and the signal node 206 is pulled do to approximately VSS by the pull amplifiers 204a, 204b. When the active input signal IN is a logic 1, signal A is a logic 0 and the signal node 206 is pulled up to approximately VDD by the second pull-up amplifier 202b. The node voltages present at this signal node 206 are buffered and inverted by the output inverter circuit 208 to produce the final output signal OUT.

Figure 2A:
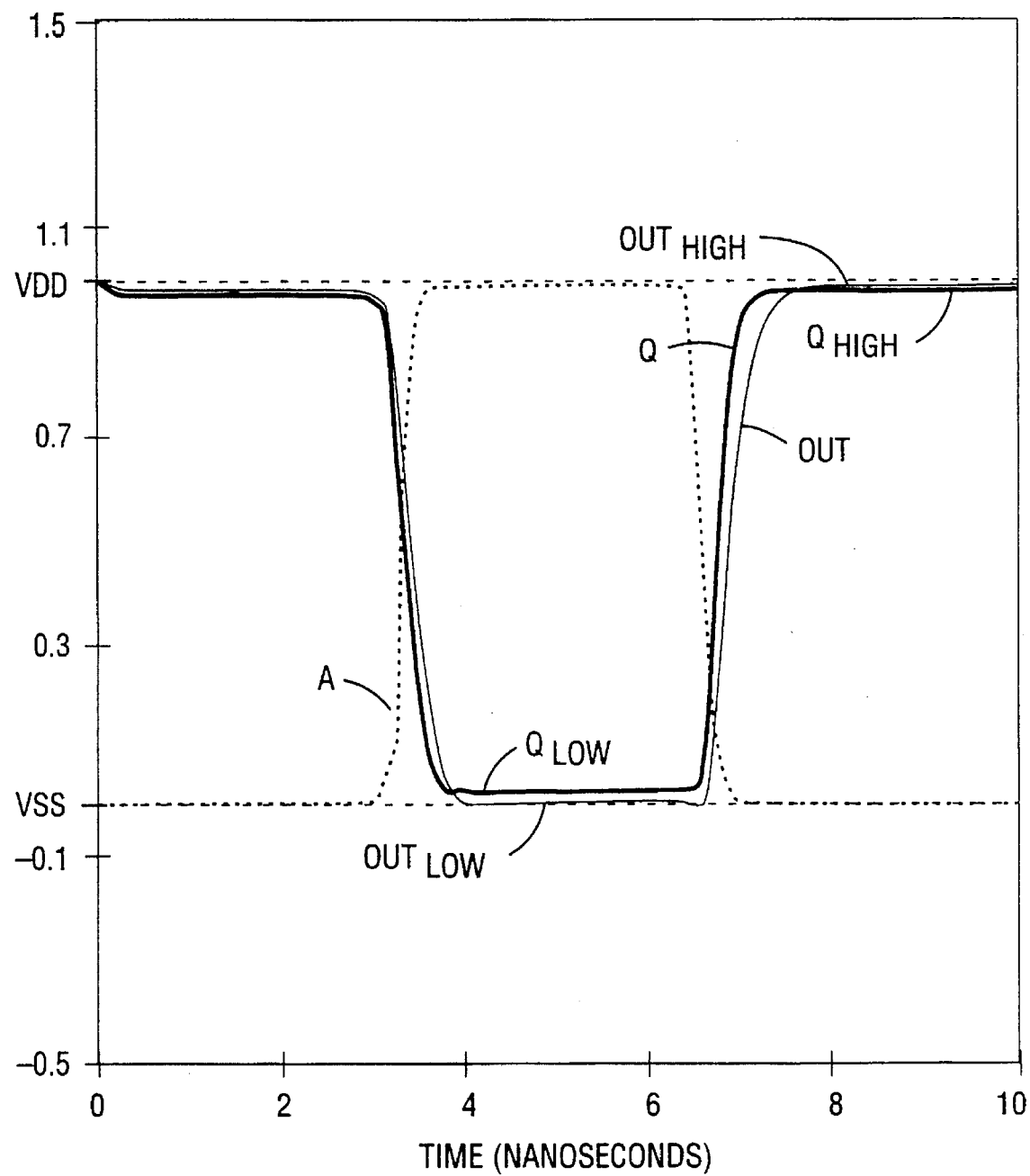
FIG. 2A is a voltage versus time plot for the circuit of FIG. 2.

Referring to FIG. 2A, a voltage versus time plot is illustrated for the circuit 200 of FIG. 2, where VDD is one volt and VSS is 0 volt. As can be seen, improved output signal levels are achieved, due to the pull-up and pull-down actions of the above-discussed pull-up and pull-down amplifiers, respectively. (The signal Q represents the output of a corresponding, conventional NAND gate design, e.g. without P-MOSFETs 212a, 212b, 226a and 226b and N-MOSFETs 216a, 216b, 222a and 222b, and is shown to illustrate the improved high and low output signal levels, i.e. $OUT_{HIGH} > Q_{HIGH}$ and $OUT_{LOW} < Q_{LOW}$, achieved with the present invention.)

Figure 3:
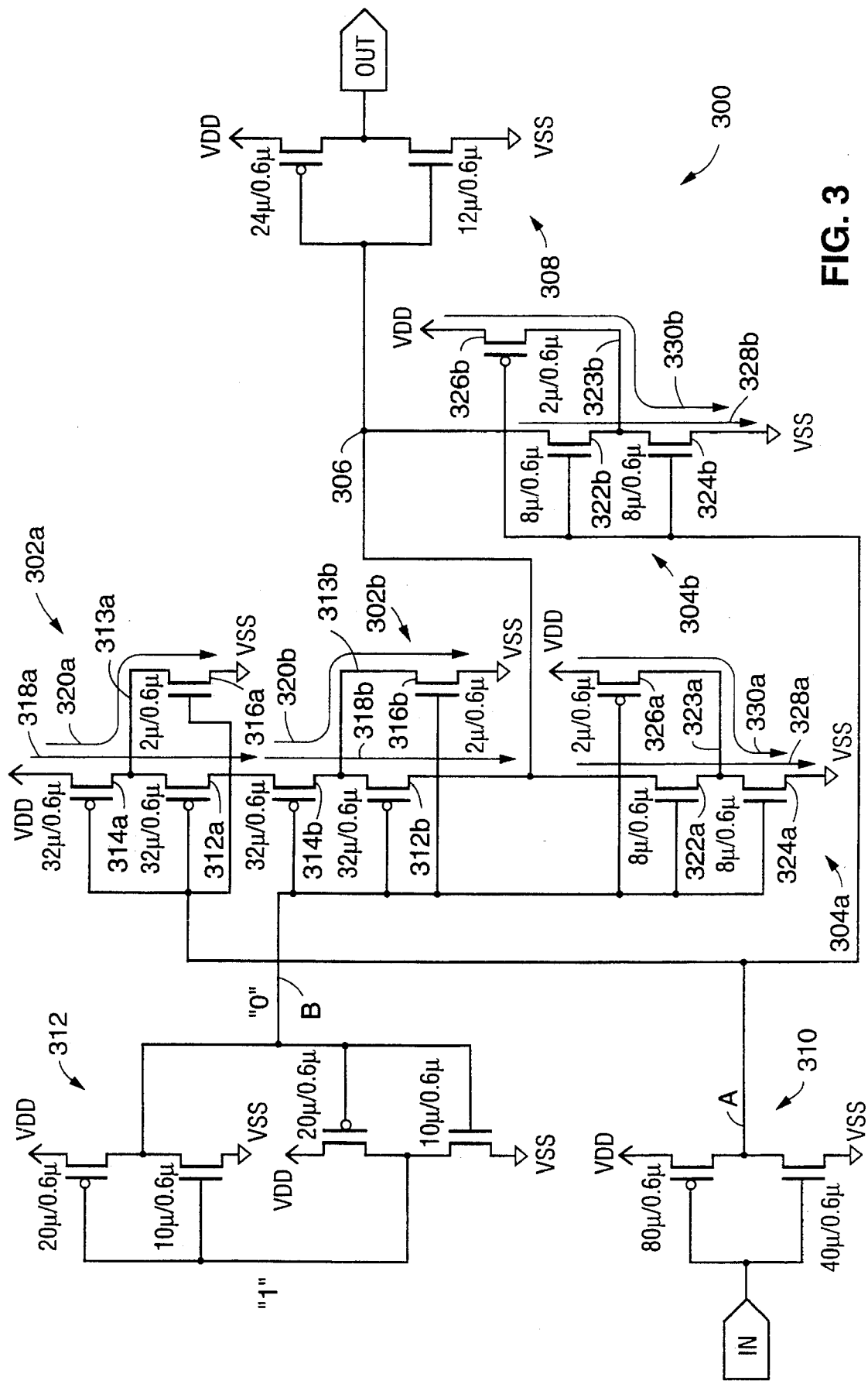
FIG. 3 is a schematic diagram of a static logic NOR gate with improved output signal levels in accordance with still another embodiment of the present invention.

Referring to FIG. 3, a static logic, 2-input NOR gate 300 with improved output signal levels in accordance with still another embodiment of the present invention includes two pull-up amplifiers 302a, 302b in series with one another and two pull-down amplifiers 304a, 304b in parallel with one another, all connected to a signal node 306, plus an output inverter circuit 308 and an input inverter circuit 310. (The operation of each of the pull-up amplifiers 302a, 302b is in accordance with the foregoing discussion for the pull-up amplifier 102 of FIG. 1, and the operation of the pull-down amplifiers 304a, 304b are in accordance with the foregoing discussion for the pull-down amplifier 104 of FIG. 1.)

The active input signal IN, via the input inverter circuit 310, drives the first pull-up amplifier 302a and the second pull-down amplifier 304b. A second input signal B, preset at a logic 0 by a static inverter latch 312, drives the second pull-up amplifier 302b and the first pull-down amplifier 304a (enabling the former and disabling the latter). When the active input signal IN is a logic 0, signal A is a logic 1 and the signal node 306 is pulled down to approximately VSS by the second pull-down amplifier 304b. When the active input signal IN is a logic 1, signal A is a logic 0 and the signal node 306 is pulled up to approximately VDD by the pull-up amplifiers 302a, 302b. The resulting node voltages at the signal node 306 are buffered and inverted by the output inverter circuit 308 to produce the final output signal OUT.

Figure 3A:
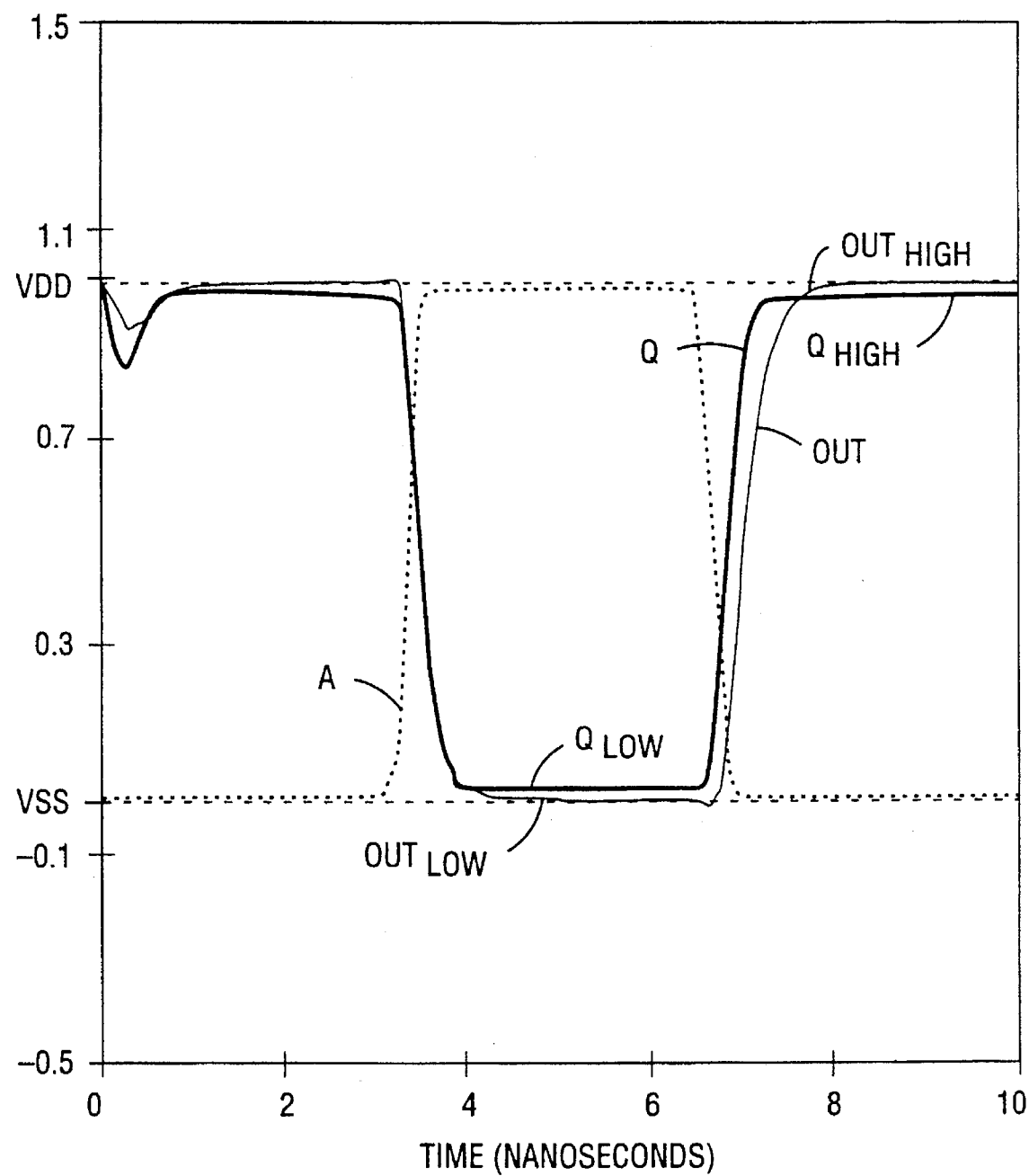
FIG. 3A is a voltage versus time plot for the circuit of FIG. 3.

Referring to FIG. 3A, a voltage versus time plot is illustrated for the circuit 300 of FIG. 3, where VDD is one volt and VSS is 0 volt. As can be seen, improved output signal levels are achieved due to the above-discussed action of the pull-up and pull-down amplifiers. (The signal Q represents the output of a corresponding, conventional NOR gate design, e.g. without P-MOSFETs 312a, 312b, 326a and 326b and N-MOSFETs 316a, 316b, 322a and 322b, and is shown to illustrate the improved high and low output signal levels, i.e. $OUT_{HIGH} > Q_{HIGH}$ and $OUT_{LOW} < Q_{LOW}$, achieved with the present invention.)

Figure 4:
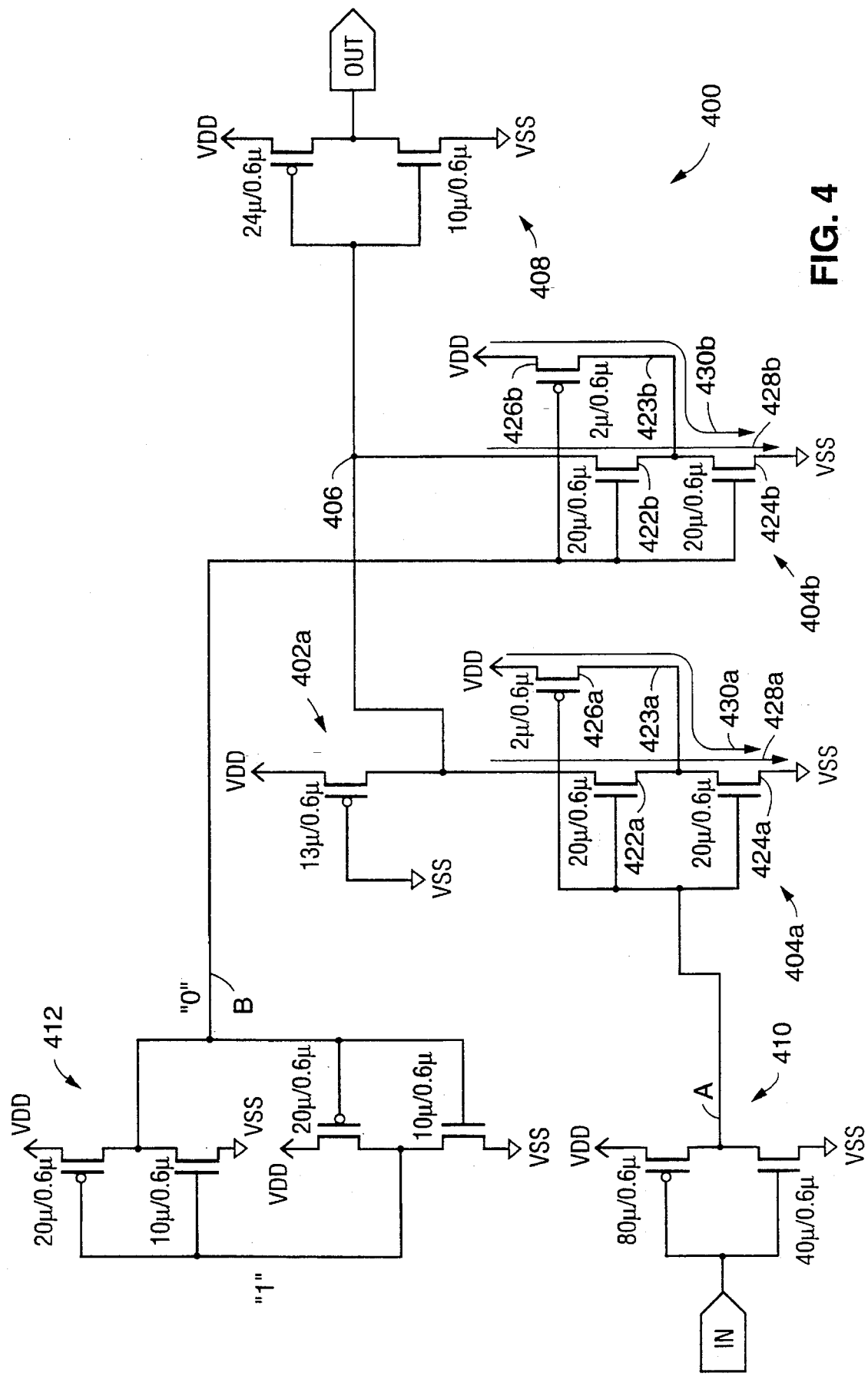
FIG. 4 is a schematic diagram of another static logic NOR gate with improved output signal levels in accordance with yet another embodiment of the present invention.

Referring to FIG. 4, a pseudo-NMOS, static logic multiple-input NOR gate 400 with improved output signal levels in accordance with yet another embodiment of the present invention includes a pull-up amplifier 402a and two pull-down amplifiers 404a, 404b, all connected to a signal node 406, plus an output inverter circuit 408 and an input inverter circuit 410. The pull-up amplifier 402a is a single P-MOSFET with a grounded gate terminal. (The operation of each of the pull-down amplifiers 404a, 404b is in accordance with the foregoing discussion for the pull-down amplifier 104 of FIG. 1.)

The active input signal IN, via the input inverter circuit 410, drives the first pull-down amplifier 404a. A second input signal B, preset at a logic 0 by a static inverter latch 412, drives the second pull-down amplifier 404b. When the active input signal IN is a logic 0, signal A is a logic 1 and the signal node 406 is pulled down to VSS by the first pull-down amplifier 404a. When the active input signal IN is a logic 1, signal A is a logic 0 and the signal node 406 is pulled up to VDD by the pull-up amplifier 402a. The resulting node voltages at the signal node 406 are buffered and inverted by the output inverter circuit 408 to produce the final output signal OUT.

Figure 4A:
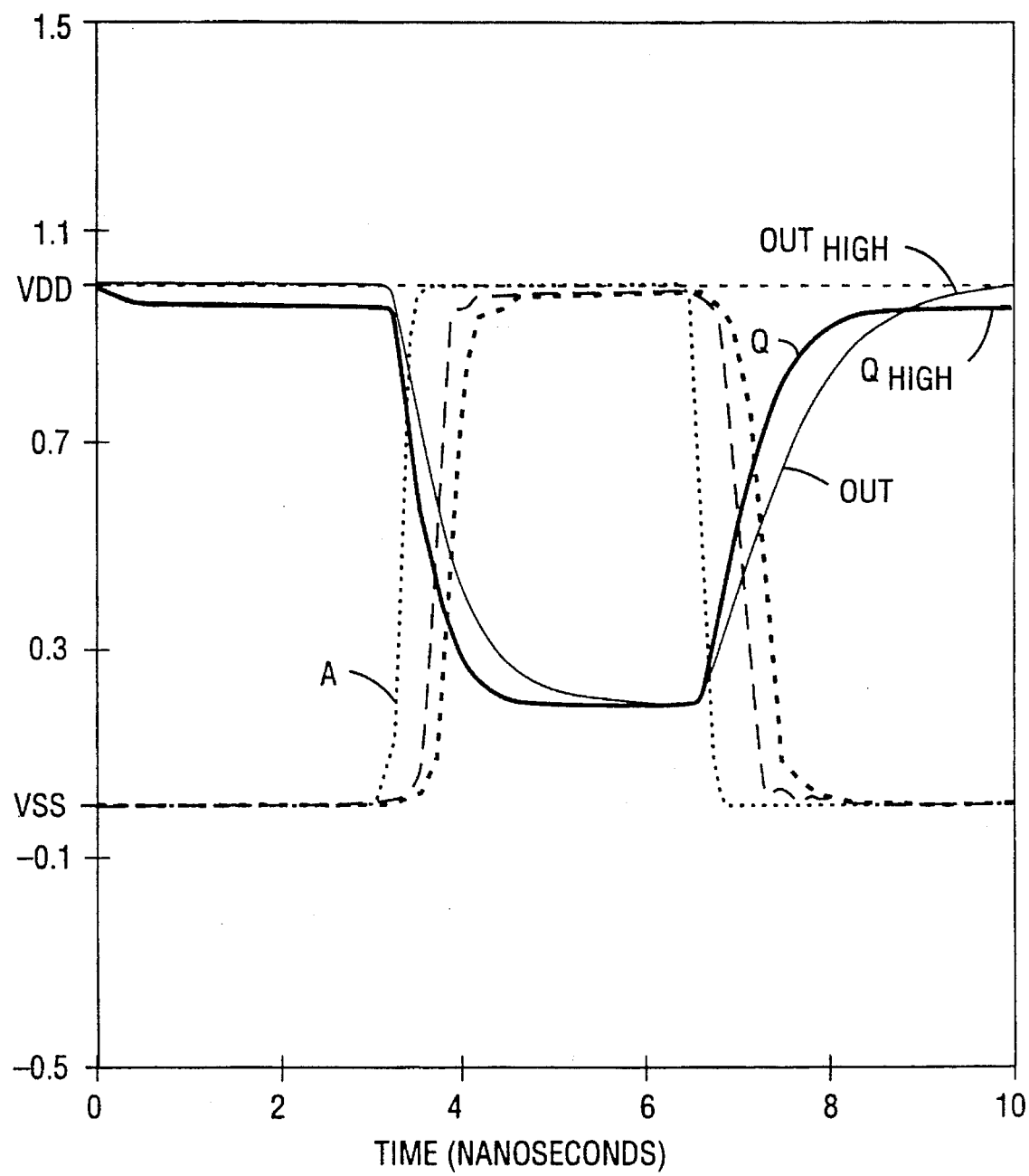
FIG. 4A is a voltage versus time plot for the circuit of FIG. 4.

Referring to FIG. 4A, a voltage versus time plot is illustrated for the circuit 400 of FIG. 4, where VDD is one volt and VSS is 0 volt. As can be seen, virtually full positive signal excursion (i.e. to VDD) is achieved. (Full "negative" signal excursion (i.e. to VSS) is not achieved due to the constant pull-up effect applied by the pull-up amplifier 402a which is always turned on.) In this "worst case" example of FIG. 4A, the NOR gate 400 of FIG. 4 was simulated as being similar to the circuit 400 of FIG. 4, but with 64 inputs instead of only 2, i.e. where an active input signal IN was provided with 63 additional static input signals $B_1$, $B_2$, $B_3$, ..., $B_{63}$ preset at logic 0. Accordingly, with a relatively large signal node 406 capacitance due to a total of 64 pull-down amplifiers $404b_1$, $404b_2$, $404b_3$, ..., $404b_{63}$ driving the signal node 406, the single-transistor pull-up amplifier 402a had some difficulty, i.e. required some additional time, in pulling the node voltage at the signal node 406 completely up to VDD. (The signal Q represents the output of a corresponding, conventional NOR gate design, e.g. without P-MOSFETs 426a and 426b and N-MOSFETs 422a and 422b, and is shown to illustrate the improved high output signal level, i.e. $OUT_{HIGH} > Q_{HIGH}$, achieved with the present invention.)

Figure 5:
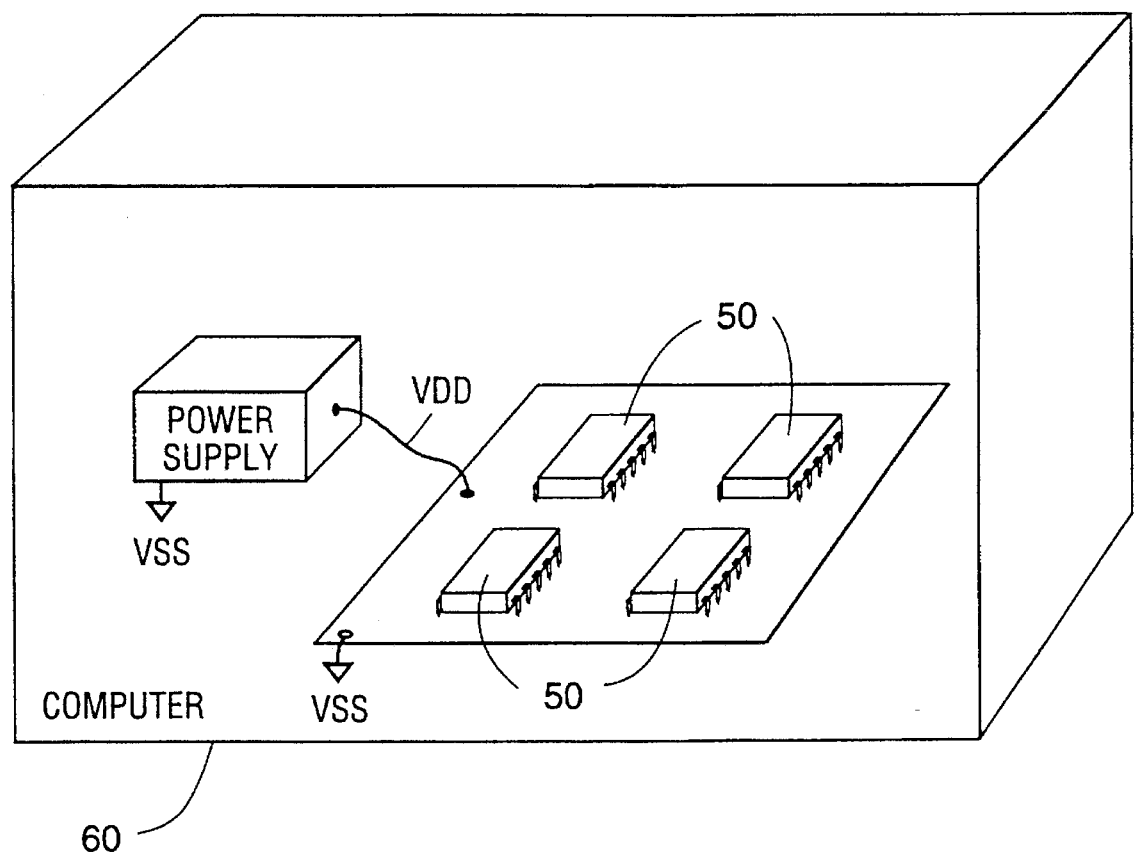
FIG. 5 represents the integration of static logic circuits with improved output signal levels in accordance with the present invention within an integrated circuit and the incorporation thereof within a computer.

Referring to FIG. 5, static logic circuits with improved output signal levels in accordance with the present invention (e.g. circuits 100, 200, 300 and 400 of FIGS. 1, 2, 3 and 4, respectively) can be used perhaps most advantageously when integrated within an integrated circuit (IC) 50. In accordance with the foregoing discussion, the IC 50 can be designed to have a number of such static logic circuits integrated therein with transistors having reduced threshold voltages so as to take maximum advantage of the power-saving benefits available with the use of lower power supply voltages (e.g. less than 3 volts) while simultaneously minimizing chances of failure due to data losses caused by charge leakage to or from data storage nodes, minimizing reductions in maximum operating frequency and providing improved output signal levels for improved noise immunity. For example, by incorporating a number of such ICs 50 into a computer 60, the system power supply requirements (e.g. output power levels, filtering, etc.) and system cooling requirements (e.g. fan size and power, quantities and sizes of heat sinks, air filters, etc.) can be relaxed, thereby resulting in a lighter, cooler-operating system.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a low powered static logic circuit with improved output signal levels, said low powered static logic circuit comprising:

a first supply node for operating at a first voltage level;

a second supply node for operating at a second voltage level;

an output signal node intermediate said first and second supply nodes;

a first input circuit, coupled between said output signal node and said first supply node, for receiving a first input signal and in response thereto coupling said output signal node to said first supply node at said first voltage level; and a first bias circuit, coupled between said output signal node and said second supply node, for receiving said first input signal and in response thereto substantially maintaining said first voltage level at said output signal node when said output signal node is coupled to said first supply node by said first input circuit.

2. An apparatus as recited in claim 1, wherein said first bias circuit substantially reduces current flow through said first input circuit when said output signal node is coupled thereby to said first supply node.

3. An apparatus as recited in claim 1, wherein said first input circuit comprises a first transistor for pulling said output signal node to said first supply node at said first voltage level.

4. An apparatus as recited in claim 3, wherein said first bias circuit comprises a second transistor coupled to an intermediate node which is intermediate said output signal node and said second supply node for pulling said intermediate node toward said first voltage level and thereby substantially reducing current flow between said output signal node and said second supply node when said output signal node is coupled to said first supply node by said first input circuit.

5. An apparatus as recited in claim 4, wherein said first transistor is a pull-up transistor, said first voltage level is VDD and said second voltage level is VSS.

6. An apparatus as recited in claim 4, wherein said first transistor is a pull-down transistor, said first voltage level is VSS and said second voltage level is VDD.

7. An apparatus as recited in claim 4, wherein said first and second transistors are P-MOS transistors.

8. An apparatus as recited in claim 4, wherein said first and second transistors are N-MOS transistors.

9. An apparatus as recited in claim 1, further comprising:

a second input circuit, coupled between said output signal node and said second supply node, for receiving a second input signal and in response thereto coupling said output signal node to said second supply node at said second voltage level; and a second bias circuit, coupled between said output signal node and said first supply node, for substantially maintaining said second voltage level at said output signal node when said output signal node is coupled to said second supply node by said second input circuit.

10. An apparatus as recited in claim 9, wherein said second bias circuit substantially reduces current flow through said second input circuit when said output signal node is coupled thereby to said second supply node.

11. An apparatus as recited in claim 1, wherein said first input circuit and said first bias circuit together include a plurality of MOS transistors.

12. An apparatus as recited in claim 1, wherein said low powered static logic circuit implements one of the following logic function: inversion; AND; OR; NAND; NOR; EXOR; and EXNOR.

13. An apparatus as recited in claim 1, further comprising an integrated circuit into which said low powered static logic circuit is integrated.

14. An apparatus as recited in claim 1, further comprising a computer into which said low powered static logic circuit is incorporated.

15. A method of providing an apparatus including a low powered static logic circuit with improved output signal levels, said method comprising the steps of:

providing a first supply node for operating at a first voltage level;

providing a second supply node for operating at a second voltage level;

providing an output signal node intermediate said first and second supply nodes;

providing a first input circuit, coupled between said output signal node and said first supply node, for receiving a first input signal and in response thereto coupling said output signal node to said first supply node at said first voltage level; and providing a first bias circuit, coupled between said output signal node and said second supply node, for receiving said first input signal and in response thereto substantially maintaining said first voltage level at said output signal node when said output signal node is coupled to said first supply node by said first input circuit.

16. A method as recited in claim 15, wherein said first bias circuit substantially reduces current flow through said first input circuit when said output signal node is coupled thereby to said first supply node.

17. A method as recited in claim 15, further comprising the steps of:

providing a second input circuit, coupled between said output signal node and said second supply node, for receiving a second input signal and in response thereto coupling said output signal node to said second supply node at said second voltage level; and providing a second bias circuit, coupled between said output signal node and said first supply node, for substantially maintaining said second voltage level at said output signal node when said output signal node is coupled to said second supply node by said second input circuit.

18. A method as recited in claim 17, wherein said second bias circuit substantially reduces current flow through said second input circuit when said output signal node is coupled thereby to said second supply node.

19. A method as recited in claim 15, further comprising the step of providing an integrated circuit into which said low powered static logic circuit is integrated.

20. A method as recited in claim 15, further comprising the step of providing a computer into which said low powered static logic circuit is incorporated.

21. A method of statically, logically processing logic signals with improved output signal levels at low power, said method comprising the steps of:

operating a first supply node at a first voltage level;

operating a second supply node at a second voltage level;

receiving a first input signal and in response thereto coupling an output signal node which is intermediate said first and second supply nodes to said first supply node at said first voltage level; and receiving said first input signal and in response thereto applying a first bias between said output signal node and said second supply node and thereby substantially maintaining said first voltage level at said output signal node when said output signal node is coupled to said first supply node in response to said first input signal.

22. A method as recited in claim 21, wherein said step of receiving said first input signal and in response thereto applying a first bias between said output signal node and said second supply node and thereby substantially maintaining said first voltage level at said output signal node when said output signal node is coupled to said first supply node in response to said first input signal comprises substantially reducing current flow from said output signal node to said second supply node when said output signal node is coupled to said first supply node in response to said first input signal.

23. A method as recited in claim 21, further comprising the steps of:

receiving a second input signal and in response thereto coupling said output signal node to said second supply node at said second voltage level; and applying a second bias between said output signal node and said first supply node and thereby substantially maintaining said second voltage level at said output signal node when said output signal node is coupled to said second supply node in response to said second input signal.

24. A method as recited in claim 23, wherein said step of applying a second bias between said output signal node and said first supply node and thereby substantially maintaining said second voltage level at said output signal node when said output signal node is coupled to said second supply node in response to said second input signal comprises substantially reducing current flow from said output signal node to said first supply node when said output signal node is coupled to said second supply node in response to said second input signal.

25. A method as recited in claim 21, further comprising the step of performing the recited steps within an integrated circuit.

26. A method as recited in claim 21, further comprising the step of performing the recited steps within a computer.

27. An apparatus including a low powered static logic circuit with improved output signal levels, said low powered static logic circuit comprising:

a first supply node for operating at a first voltage level;

a second supply node for operating at a second voltage level;

an output signal node intermediate said first and second supply nodes;

a first input circuit, coupled between said output signal node and said first supply node, for receiving a first input signal and in response thereto coupling said output signal node to said first supply node at said first voltage level; and a first bias circuit, coupled between said output signal node and said second supply node, for substantially maintaining said first voltage level at said output signal node when said output signal node is coupled to said first supply node by said first input circuit;

wherein said first input circuit and said first bias circuit together include a plurality of MOS transistors, and wherein each one of said plurality of MOS transistors is for operating at a poewr supply voltage of less than 3.5 volts.

* * * * *

UNITED STATES PATENT AND TRADEMARK OFFICE
CERTIFICATE OF CORRECTION

PATENT NO. : 5,546,022
DATED : August 13, 1996
INVENTOR(S) : Godfrey P. D'Souza, Douglas A. Laird It is certified that error appears in the above-identified patent and that said Letters Patent is hereby corrected as shown below:

Column 10, claim 27,
Line 53, delete "poewr" and insert -- power --.

Signed and Sealed this

Sixth Day of November, 2001

*Attest:*

*Attesting Officer*

NICHOLAS P. GODICI
*Acting Director of the United States Patent and Trademark Office*